United States Patent [19]

Nishiguchi et al.

[11] Patent Number: 5,092,033

[45] Date of Patent: Mar. 3, 1992

[54] METHOD FOR PACKAGING SEMICONDUCTOR DEVICE

[75] Inventors: Masanori Nishiguchi; Atsushi Miki, both of Yokohama, Japan

[73] Assignee: Sumitomo Electric Industries, Ltd., Osaka, Japan

[21] Appl. No.: 644,566

[22] Filed: Jan. 23, 1991

[30] Foreign Application Priority Data

Jan. 23, 1990 [JP] Japan ................................ 2-13418
Jan. 23, 1990 [JP] Japan ................................ 2-13419

[51] Int. Cl.[5] .................................................. H05K 3/34
[52] U.S. Cl. ........................................ 29/840; 29/834; 437/8
[58] Field of Search ................ 29/407, 832, 834, 840, 29/843; 437/8; 357/74

[56] References Cited

U.S. PATENT DOCUMENTS 4,776,088 11/1988 Biggs et al. ...................... 29/407 X
4,924,589 5/1990 Leedy ................................... 29/832
4,970,780 11/1990 Suda et al. ........................... 29/840

Primary Examiner—Timothy V. Eley
Attorney, Agent, or Firm—Cushman, Darby & Cushman

[57] ABSTRACT

The present invention comprises the steps of electrically connecting at least one pair of bumps on the semiconductor device, bringing the bumps into contact with a surface of the packaging substrate and moving the semiconductor device relative to the packaging substrate while monitoring whether at least one pair of electrode terminals formed on the surface of the packaging substrate are electrically connected to each other, positioning the semiconductor device with respect to the packaging substrate at a position where the electrode terminals whose electrical connection is monitored are electrically connected to each other, and packaging the semiconductor electrode on the packaging substrate.

7 Claims, 4 Drawing Sheets

METHOD FOR PACKAGING SEMICONDUCTOR DEVICE

BACKGROUND OF THE INVENTION

1. Field of the Invention

The present invention relates to a method of directly connecting (face-down bonding) bumps extending on a surface of a semiconductor device such as an IC chip to electrode terminals on a packaging substrate, thereby packaging the semiconductor device on the packaging substrate, packaging structure and packaging substrate.

2. Related Background Art

When bumps formed on a semiconductor device are to be directly connected to electrode terminals on a packaging substrate to package the semiconductor device on the packaging substrate, in a conventional system, the positions of the electrode terminals on the packaging substrate are confirmed by a television camera or an image processing apparatus, and the bumps on the semiconductor device are aligned with the positions of the electrode terminals, thereby packaging the semiconductor device on the packaging substrate.

Since the bumps and the electrode terminals, however, are opposed to each other upon alignment, the actual alignment state cannot be observed. An outer appearance of the semiconductor device upon its observation from the lower surface is observed, and the positions of the bumps are estimated from the observed outer appearance. For this reason, when deformation such as cracks is present in the outer appearance of the semiconductor device, accurate alignment cannot be performed.

SUMMARY OF THE INVENTION

It is an object of the present invention to provide a method of packaging a semiconductor device on a packaging substrate so that bumps on the semiconductor device are accurately aligned with electrode terminals on the packaging substrate even if deformation such as cracks is present in the semiconductor device.

In order to achieve the above object of the present invention, there is provided a method of packaging a semiconductor device, comprising electrically connecting at least one pair of bumps on the semiconductor device, bringing the bumps into contact with a surface of the packaging substrate and moving the semiconductor device relative to the packaging substrate while monitoring whether at least one pair of electrode terminals formed on the surface of the packaging substrate are electrically connected to each other, positioning the semiconductor device with respect to the packaging substrate at a position where the electrode terminals whose electrical connection is monitored are electrically connected to each other, and packaging the semiconductor electrode on the packaging substrate.

According to the above method, when the semiconductor device is aligned with the packaging substrate and the bumps on the semiconductor device are brought into contact with the electrode terminals formed in correspondence with the bumps, this contact is detected as an electric connection between the electrode terminals.

Further, a method of packaging a semiconductor device according to the present invention comprises the steps of clamping an anisotropic conductive film between bumps on a semiconductor device and electrode terminals on a packaging substrate, the anisotropic conductive film having a higher conductivity in a direction perpendicular to a film surface than that in a direction parallel to the film surface, measuring electrical resistances between at least two bumps and electrode terminals corresponding thereto, positioning the semiconductor device with respect to the packaging substrate at a position where the electrical resistances are minimized, and packaging the semiconductor device on the packaging substrate after the anisotropic conductive film is removed from the bumps and the electrode terminals.

According to the above method, the distance (positional errors) between the bumps on the semiconductor device and the electrode terminals on the packaging substrate can be measured by the magnitudes of electrical resistances.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWNGS

Figure 5:
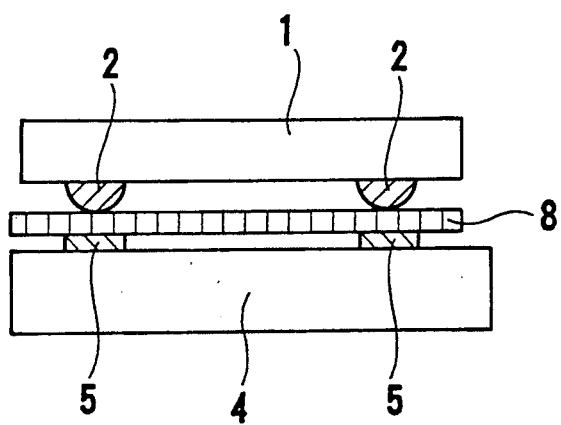
Figure 6:
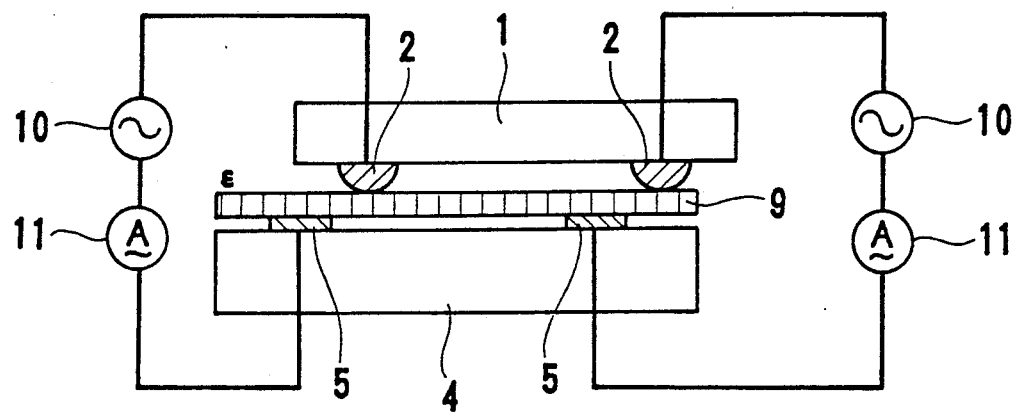
Figure 7:
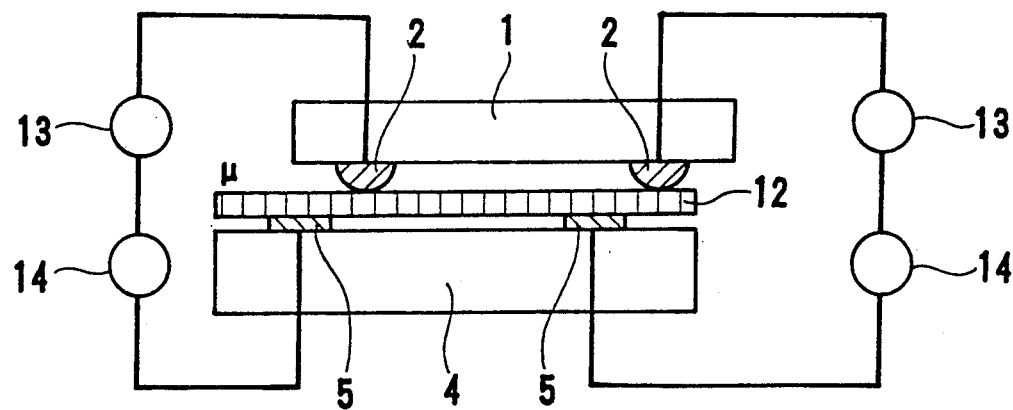

FIG. 5 is a view showing the semiconductor device after alignment relative to the packaging substrate according to the second embodiment in cross section on the perpendicular direction to the substrate surface; and FIGS. 6 and 7 are views showing a semiconductor device aligned relative to a packaging substrate according to the modification of the second embodiment of the present invention in cross section on the perpendicular direction to the substrate surface.

DESCRIPTION OF THE PREFERRED EMBODIMENT

Figure 2:
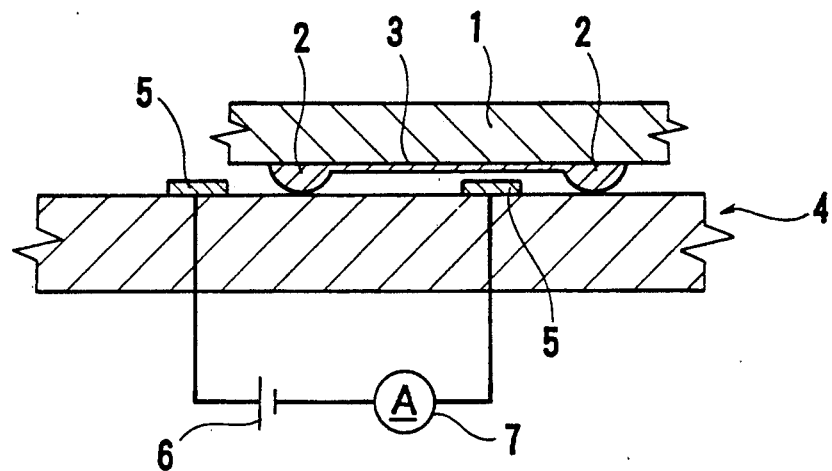
FIG. 2 is a view showing a semiconductor device aligned relative to a packaging substrate according to the first embodiment in cross section on the perpendicular direction to the substrate surface.
Figure 3:
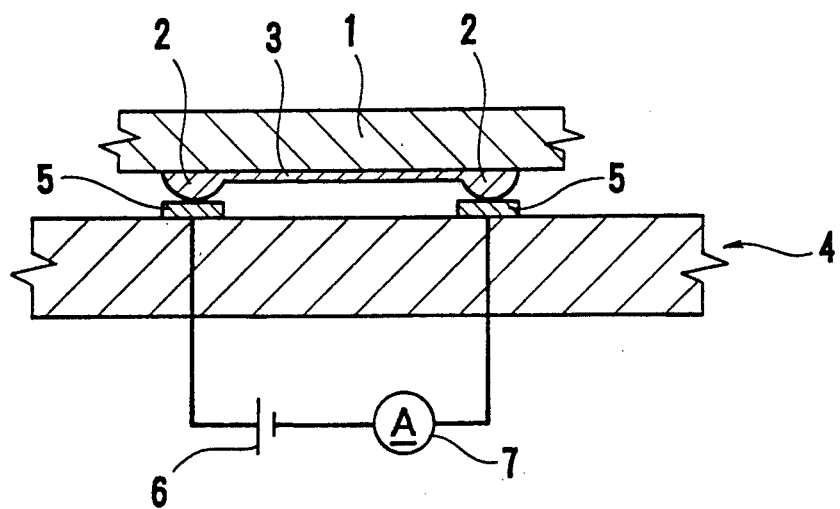
FIG. 3 is a view showing the semiconductor device after alignment relative to the packaging substrate according to the first embodiment in cross section on the perpendicular direction to the substrate surface.

The first embodiment of the present invention will be described with reference to FIGS. 1 to 3.

Figure 1A:
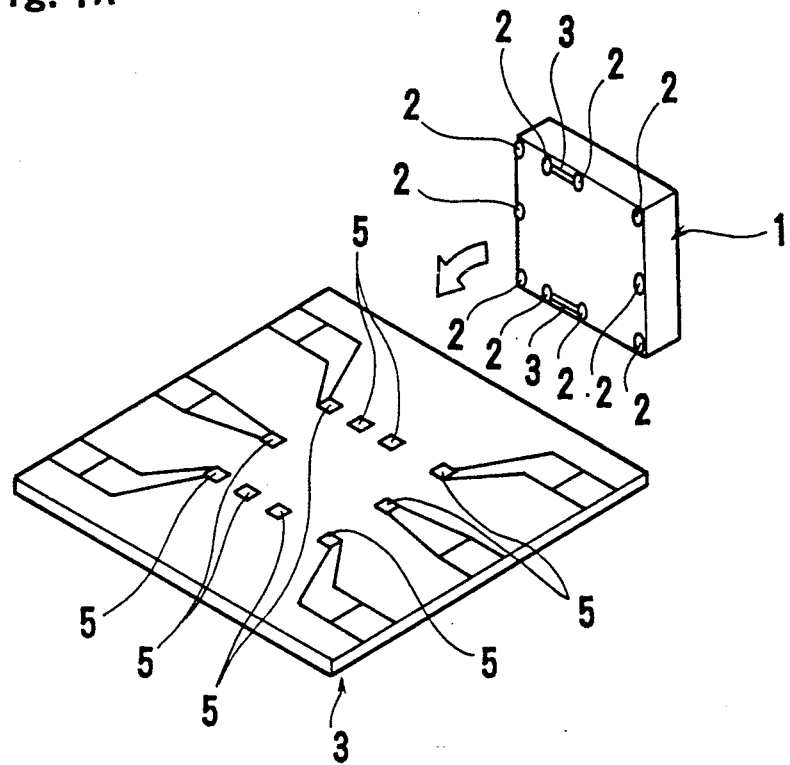
FIGS. 1A and 1B are views showing a process for connection of a semiconductor device to a packaging substrate according to the first embodiment of the present invention.
Figure 1B:
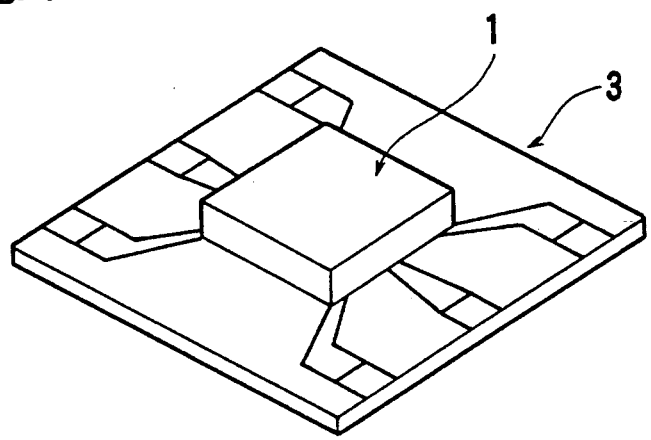

Referring to FIGS. 1A and 1B, a plurality of bumps 2 extend on the surface of a semiconductor device 1, and at least one pair of bumps 2 are electrically connected to each other through a metal wire 3 formed on the surface of the semiconductor device 1. Electrode terminals 5 corresponding to the bumps 2 are formed on the surface of a packaging substrate 4 on which the semiconductor device 1 is to be packaged.

A detecting means is connected to the pair of electrode terminals 5 in correspondence with the bumps 2 electrically connected to each other. When the electrode terminals 5 are brought into contact with the bumps 2, the detecting means detects whether the electrode terminals 5 are electrically connected to each other. The detecting means comprises a DC power source 6 and a DC ammeter 7 which are connected in series between the electrode terminals 5.

An operation for directly connecting the bumps 2 to the electrode terminals 5 to package the semiconductor device 1 on the packaging substrate 4 will be described below. According to the packaging method of the present embodiment, the bumps 2 of the semiconductor device 1 are brought into contact with the surface of the packing substrate 4 which has the electrode terminals 5 thereon. The semiconductor device 1 is slid relative to the packaging substrate 4 while electrical connection between the electrode terminals 5 is monitored by the detecting means (see FIG. 2). When the pair of electrode terminals 5 connected to the detecting means are brought into contact with the pair of bumps 2 electrically connected to each other (See FIG. 3), the electrode terminals 5 are electrically connected through the bumps 2 and the metal wire 3. Since the bumps 2 are formed in correspondence with the electrode terminals 5, when the electrode terminals 5 are electrically connected to each other, all the bumps 2 formed on the semiconductor device 1 are aligned with the electrode terminals 5 formed on the packaging substrate 4 in correspondence with the electrode terminals 5. As shown in FIG. 3, when the semiconductor device 1 is aligned with the packaging substrate 4 and electrical connection between the electrode terminals 5 is detected by the detecting means, sliding of the semiconductor device 1 along the packaging substrate 4 is stopped, and the semiconductor device 1 is positioned at this position with respect to the packaging substrate 4. Thereafter, the packaging substrate 4 is heated and a preliminary solder applied to the electrode terminals 5 is reflowed to directly connect the bumps 2 on the semiconductor device 1 to the electrode terminals 5 on the packaging substrate 4. Therefore, the semiconductor device 1 is packaged on the packaging substrate 4.

When the size of each of the bumps 2 connected to each other and the size of each of the electrode terminals 5 formed in correspondence with the bumps 2 are reduced, the alignment precision can be improved. In addition, when a plurality of pairs of bumps 2 electrically connected to each other are prepared and spaced apart from each other, electrical connection between the corresponding electrode terminals 5 is detected to further improve alignment precision.

The size of each of the bumps 2 connected to each other is given as 10 μm in diameter, and the size of each of the electrode terminals 5 formed on the board in correspondence with the bumps 2 is given as 10 μm in diameter. Alignment precision according to the present invention is compared with that of the conventional alignment apparatus, and a comparison result is summarized as follows.

|  | Alignment Precision |
|---|---|
| Conventional Case | ±100 μm |
| Present Invention | ±10 μm |

According to the first embodiment of the present invention, as has been described above, upon detection of electrical connection between the electrode terminals formed on the packing substrate, an alignment state between the bumps on the semiconductor device and the electrode terminals on the packaging substrate can be checked. Even if deformation such as cracks in a semiconductor device is present, the bumps on the semiconductor device can be aligned with the electrode terminals on the packaging substrate and packaged on the packaging substrate with high precision.

The second embodiment of the present invention will be described with reference to FIGS. 4 and 5.

Figure 4:
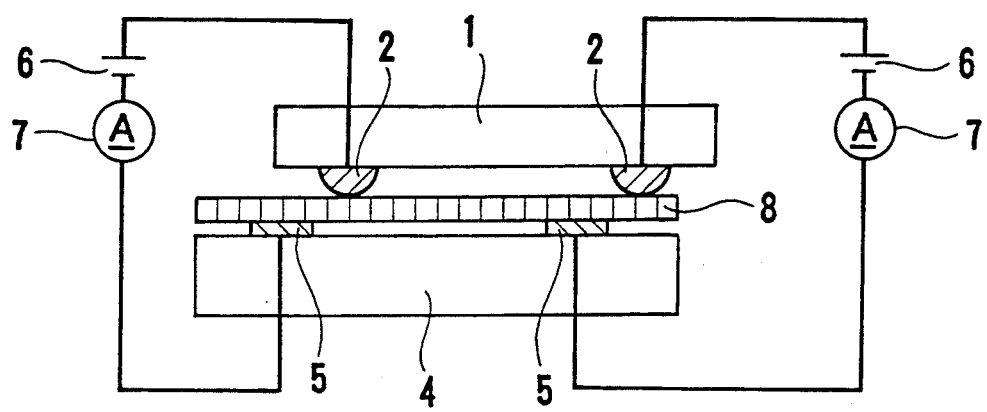
FIG. 4 is a view showing a semiconductor device aligned relative to a packaging substrate according to the second embodiment of the present invention in cross section on the perpendicular direction to the substrate surface.

Referring to FIG. 4 and 5, bumps 2 extend on the surface of a semiconductor device 1, and electrode terminals 5 to be connected to the bumps 2 are formed on a packaging substrate 4, on which the semiconductor device 1 is to be packaged, in correspondence with the bumps 2.

When the bumps 2 formed as described above are to be directly connected to the electrode terminals 5 to package the semiconductor device 1 on the packaging substrate 4, electrical resistance measuring means are connected between the pairs of the bumps 2 and the electrode terminals 5, respectively, according to the packaging method of the present invention. Each electrical resistance measuring means comprises, e.g., a DC power source 6 and a DC ammeter 7. Each measuring means is connected in series between the corresponding pair of the bump 2 and the electrode terminal 5. An anisotropic conductive film 8 is prepared. The anisotropic conductive film 8 has a higher conductivity in a direction perpendicular to its film surface than that in a direction parallel to the film surface. The anisotropic conductive film 8 is inserted between the bumps 2 on the semiconductor device 1 and the electrode terminals 5 on the packaging substrate 4. The bumps 2 and the electrode terminals 5 are brought into tight contact with the anisotropic conductive film 8, and a current is supplied to current paths respectively constituted by the pairs of the bumps 2 and the electrode terminals 5, thereby measuring electrical resistances between the bumps 2 and the electrode terminals 5. In the illustrated embodiment, the electrical resistances are measured as current values between the bumps 2 and the electrode terminals 5. The electrical resistances between the bumps 2 and the electrode terminals 5 vary in accordance with distances between points where the bumps 2 are in contact with the anisotropic conductive film 8 and points where the corresponding electrode terminals 5 are in contact with the anisotropic conductive film 8. When a positional error between the bump 2 and the corresponding electrode terminal 5 is increased, an electrical resistance is increased. When the semiconductor device 1 is moved relative to the packaging substrate 4 so that this resistance is minimized, the bumps 2 and the mating electrode terminals 5 are accurately aligned. This alignment operation is performed for at least two pairs of bumps 2 on the semiconductor device 1 and electrode terminals 5 on the packaging substrate 4. Therefore, accurate alignment between all the bumps 2 formed on the semiconductor device 1 and all the electrode terminals 5 formed on the packaging substrate 4 in correspondence with all the bumps 2 can be performed. The semiconductor device 1 and the packaging substrate 4 which are accurately aligned with each other are positioned so that their positional relationship is kept unchanged. The anisotropic conductive film 8 is then removed from the semiconductor device 1 and the packaging substrate 4. Thereafter, the packaging substrate 4 is heated, and a preliminary solder applied to the electrode terminals 5 is reflowed to directly connect the bumps 2 on the semiconductor device 1 to the electrode terminals 5 on the packaging substrate 4, thereby packaging the semiconductor device 1 on the packaging substrate 4.

Alignment precision between the bumps on the semiconductor device and the electrode terminals on the packaging substrate according to the present invention is compared with that according to the conventional arrangement, and a comparison result is shown below.

|  | Alignment Precision |
|---|---|
| Conventional Case | ±100 μm |
| Present Invention | ±10 μm |

In the above test, each of the size of the bump and the size of the electrode terminal was set to be 10 μm in diameter.

A modification of the second embodiment will be described with reference to FIGS. 6 and 7. In the above embodiment, the conductive member is used as a resistance member. However, a dielectric member 9 made of a dielectric material having a minimum or maximum capacitance in a direction perpendicular to a board surface may be used as the resistance member. In this case, an AC power source 10 is used in place of the DC power source 6, and an AC ammeter 11 is used in place of the DC ammeter 7, thereby forming an induction circuit including the bump 2 and the electrode terminal 5 (FIG. 6).

A magnetic member 12 made of a magnetic material having a minimum reluctance in a direction perpendicular to the board surface may be used as a resistance member. In this case, a magnetic source 13 such as a magnet for generating a magnetic force is used in place of the DC power source 6, and a magnetic flux meter 14 is used in place of the DC ammeter 7, thereby forming a magnetic circuit including the bump 2 and the electrode terminal 5 (FIG. 7).

According to the second embodiment, as has been described above, the distances (positional errors) between the bumps on the semiconductor device and the electrode terminals on the packaging substrate can be measured as the magnitudes of electrical resistances, capacitance or reluctance. Therefore, alignment is performed so that the electrical resistances, capacitance or reluctance are minimized. Even if deformation such as cracks is present in the semiconductor device, the bumps on the semiconductor device can be accurately aligned with the electrode terminals on the packaging substrate with high precision.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:
1. A method of directly connecting a bump extending from a surface of a semiconductor device to an electrode terminal on a packaging substrate to package said semiconductor device on said packaging substrate, comprising the steps of:
   electrically connecting at least two bumps on said semiconductor device to each other;
   bringing said at least two bumps into contact with a surface of said packaging substrate and sliding said semiconductor device relative to said packaging substrate while at least two electrode terminals formed on said surface of said packaging substrate in correspondence with said bumps electrically connected to each other are monitored to determine whether the electrode terminals are electrically connected;
   positioning said semiconductor device with respect to said packaging substrate at a position where said electrode terminals whose electrical connection is monitored are electrically connected to each other; and
   packaging said semiconductor device on said packaging substrate.

2. A method of directly connecting a bump extending on a surface of a semiconductor device to an electrode terminal on a packaging substrate, thereby packaging said semiconductor device on said packaging substrate, comprising the steps of:
   clamping a conductive member between said semiconductor device and said packaging substrate to bring a bump on said semiconductor device into contact with an electrode terminal on said packaging substrate;
   measuring an electrical resistance between said bump and said electrode terminal which are to be directly connected to each other;
   positioning said semiconductor device with respect to said packaging substrate at a position where the electrical resistance is minimized; and
   packaging said semiconductor device on said packaging substrate after said conductive member is removed from said bump and said electrode terminal.

3. A method according to claim 2, wherein said conductive member comprises an anisotropic conductive film having a higher conductivity in a direction perpendicular to a film surface than that in a direction parallel to the film surface.

4. A method of directly connecting a bump extending from a surface of a semiconductor device to an electrode terminal on a packaging substrate, thereby packaging said semiconductor device on said packaging substrate, comprising the steps of:
   clamping a resistance member between said semiconductor device and said packaging substrate to bring said resistance member into contact with a bump on said semiconductor device and a terminal electrode on said packaging substrate;
   measuring a resistance of a closed circuit formed between a bump and an electrode terminal which are to be directly connected to each other;
   positioning said semiconductor device with respect to said packaging substrate at a position where the resistance is minimized; and
   packaging said semiconductor device on said packaging substrate after said resistance member is removed from said bump and said electrode terminal.

5. A method according to claim 4, wherein said resistance member is made of an anisotropic material having a higher permittivity in a direction perpendicular to a surface of said packaging substrate than that in a direction parallel thereto, and said closed circuit is an induction circuit.

6. A method according to claim 4, wherein said resistance member is made of an anisotropic magnetic material having a higher magnetic permeability in a direction perpendicular to a surface of said packaging substrate than that in a direction parallel thereto.

7. A method of directly connecting a bump extending on a surface of a semiconductor device to an electrode terminal on a packaging substrate, thereby packaging said semiconductor device on said packaging substrate, comprising the step of:

clamping a conductive member between said semiconductor device and said packaging substrate to bring a bump on said semiconductor device into contact with an electrode terminal on said packaging substrate;

measuring an electrical resistance between said bump and said electrode terminal which are to be directly connected to each other;

positioning said semiconductor device with respect to said packaging substrate at a position where the electrical resistance is minimized; and packaging said semiconductor device on said packaging substrate with said conductive member clamped between said semiconductor device and said packaging substrate.

* * * * *